(12) United States Patent
Xu et al.

(10) Patent No.: US 12,136,953 B2
(45) Date of Patent: Nov. 5, 2024

(54) CONTACTLESS CONNECTOR AND CONTACTLESS CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Hai-Jun Xu, Kunshan (CN); Tung-Lou Lin, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/696,666

(22) Filed: Mar. 16, 2022

(65) Prior Publication Data
US 2022/0303015 A1    Sep. 22, 2022

(30) Foreign Application Priority Data

Mar. 18, 2021    (CN) .......................... 202110291407.4

(51) Int. Cl.
| | | |
|---|---|---|
| *H04B 10/00* | (2013.01) |
| *G02B 19/00* | (2006.01) |
| *G02B 27/30* | (2006.01) |
| *H04B 10/11* | (2013.01) |
| *H04B 10/50* | (2013.01) |

(Continued)

(52) U.S. Cl.
CPC ....... *H04B 10/501* (2013.01); *G02B 19/0009* (2013.01); *G02B 19/0047* (2013.01); *G02B 27/30* (2013.01); *H04B 10/11* (2013.01); *H05K 1/0274* (2013.01); *G01R 33/07* (2013.01);

(Continued)

(58) Field of Classification Search
CPC .... H04B 10/501; H04B 10/11; H04B 10/803; G02B 19/0009; G02B 19/0047; G02B 27/30; G02B 6/3886; G02B 6/4204; G02B 6/4281; G02B 6/4292; G02B 6/3897; G02B 6/428; H05K 1/0274; H05K 2201/08; H05K 2201/10121; H05K 2201/10151; G01R 33/07; G01R 33/072
See application file for complete search history.

(56) References Cited

U.S. PATENT DOCUMENTS 4,641,915 A * 2/1987 Asakawa ............. G02B 6/3886
                                                         385/61
4,753,510 A * 6/1988 Sezerman ................ G02B 6/32
                                                         385/63

(Continued)

FOREIGN PATENT DOCUMENTS

CN            1163028 A     10/1997
CN          105095943 A     11/2015

(Continued)

*Primary Examiner* — Agustin Bello
(74) *Attorney, Agent, or Firm* — Ming Chieh Chang

(57) ABSTRACT

A contactless connector includes: a circuit board; a light emitter arranged on the circuit board and capable of converting electrical signals into optical signals; a light emitter control chip arranged on the circuit board for controlling the operation of the light emitter; and a light-transmitting member at least partially covering the circuit board, the light emitter, and the light emitter control chip.

14 Claims, 17 Drawing Sheets

(51) Int. Cl.
*H05K 1/02* (2006.01)
*G01R 33/07* (2006.01)

(52) U.S. Cl.
CPC .............. *H05K 2201/08* (2013.01); *H05K 2201/10121* (2013.01); *H05K 2201/10151* (2013.01)

(56) References Cited

U.S. PATENT DOCUMENTS

| | | | | |
|---|---|---|---|---|
| 4,903,340 A * | 2/1990 | Sorensen | ............. | G02B 6/4295 398/117 |
| 4,915,466 A * | 4/1990 | Sorensen | ............. | G02B 6/3897 385/56 |
| 5,093,879 A * | 3/1992 | Bregman | .............. | H01L 31/167 398/164 |
| 5,133,032 A * | 7/1992 | Salter | .................. | G02B 6/3825 385/59 |
| 5,202,567 A * | 4/1993 | Hamanaka | ............... | G02B 6/43 250/208.2 |
| 5,241,612 A * | 8/1993 | Iwama | ...................... | G02B 6/32 385/74 |
| 5,260,587 A * | 11/1993 | Sato | ..................... | G02B 6/4249 372/50.1 |
| 5,280,184 A * | 1/1994 | Jokerst | .............. | H01L 27/14694 257/85 |
| 5,362,961 A * | 11/1994 | Hamanaka | ............... | G02B 6/32 398/164 |
| 5,401,983 A * | 3/1995 | Jokerst | .............. | H01L 27/14643 257/85 |
| 5,475,215 A * | 12/1995 | Hsu | ...................... | G02B 6/4204 250/551 |
| 5,734,328 A * | 3/1998 | Shinbori | .............. | H04N 1/2112 307/37 |
| 5,930,428 A * | 7/1999 | Irwin | ................... | G02B 6/4284 385/88 |
| 5,986,788 A * | 11/1999 | Sasaki | .................... | G02B 6/425 398/118 |
| 5,999,295 A * | 12/1999 | Vowell | ................. | H04B 10/801 398/118 |
| 6,375,362 B1 * | 4/2002 | Heiles | .................. | G02B 6/3897 385/55 |
| 6,525,854 B1 * | 2/2003 | Takahashi | .......... | H04B 10/1143 398/115 |
| 6,558,045 B2 * | 5/2003 | Yamaguchi | .......... | G02B 6/4277 439/577 |
| 6,825,708 B1 * | 11/2004 | Drost | .................. | H03K 5/003 327/515 |
| 6,863,453 B2 * | 3/2005 | Wang | ................... | G02B 6/4249 385/94 |
| 7,079,733 B2 * | 7/2006 | Toriumi | ................ | G02B 6/4416 439/577 |
| 7,160,032 B2 * | 1/2007 | Nagashima | .......... | G02B 6/4201 385/101 |
| 7,369,334 B2 * | 5/2008 | Case | ........................ | G02B 6/32 359/744 |
| 7,369,726 B2 * | 5/2008 | Drost | ..................... | H01L 23/48 398/164 |
| 7,428,110 B2 * | 9/2008 | Tamada | .................. | G02B 7/003 353/101 |
| 7,499,616 B2 * | 3/2009 | Aronson | ............... | G02B 6/4284 385/100 |
| 8,021,057 B2 * | 9/2011 | Tamura | ............... | G02B 6/4244 385/75 |
| 8,128,558 B2 * | 3/2012 | Amling | .............. | A61B 1/00126 439/577 |
| 8,189,361 B2 * | 5/2012 | Zhou | .................. | H01L 25/0652 257/E33.076 |
| 8,244,134 B2 * | 8/2012 | Santori | ................ | H04B 10/803 398/118 |
| 8,577,195 B2 * | 11/2013 | Terlizzi | ................ | G02B 6/4292 385/101 |
| 8,974,126 B2 * | 3/2015 | Sloey | ................... | G02B 6/4204 385/93 |
| 9,019,033 B2 * | 4/2015 | McCarthy | ................ | H01P 5/00 333/24 R |
| 9,300,083 B2 * | 3/2016 | Bosscher | ............... | H02J 50/90 |
| 9,344,184 B2 * | 5/2016 | Schrader | ............... | H04L 67/12 |
| 9,354,401 B2 * | 5/2016 | Leigh | ................... | G02B 6/3866 |
| 9,369,208 B2 * | 6/2016 | Chou | ..................... | H04B 10/60 |
| 9,575,270 B2 * | 2/2017 | Sharapov | ............... | H01L 23/48 |
| 9,784,953 B2 * | 10/2017 | Rosenberg | ........... | H04B 10/803 |
| 9,791,634 B2 * | 10/2017 | DiFonzo | .............. | G02B 6/3817 |
| 10,236,936 B2 * | 3/2019 | McCormack | ........... | H04B 5/00 |
| 10,281,657 B2 * | 5/2019 | Sullivan | ............... | G02B 6/4292 |
| 10,469,175 B2 * | 11/2019 | Jachetta | ............... | G02B 6/4261 |
| 10,502,910 B2 * | 12/2019 | Leigh | ................... | G02B 6/4245 |
| 10,585,249 B2 * | 3/2020 | Otani | ................... | H01L 31/0203 |
| 10,601,105 B2 * | 3/2020 | McCormack | .......... | H01Q 1/525 |
| 10,707,627 B2 * | 7/2020 | Nasiri Mahalati | .......................... H01R 13/6675 |
| 10,720,689 B2 * | 7/2020 | Shook | .................. | H04B 5/0031 |
| 10,756,824 B2 * | 8/2020 | Sundaram | ........... | G02B 6/4246 |
| 10,768,375 B2 * | 9/2020 | Leigh | ................... | G02B 6/3882 |
| 11,552,708 B2 * | 1/2023 | Schneider | ............... | H04B 5/02 |
| 2002/0044746 A1 * | 4/2002 | Kronlund | ............. | G02B 6/4284 385/101 |
| 2002/0159725 A1 * | 10/2002 | Bucklen | ............... | G02B 6/4249 385/101 |
| 2004/0159777 A1 * | 8/2004 | Stone | ................... | G02B 6/4246 250/216 |
| 2005/0036789 A1 * | 2/2005 | Bjorndahl | ........... | H04B 10/801 398/118 |
| 2006/0114580 A1 * | 6/2006 | Mori | ................... | G02B 19/0014 |
| 2008/0131058 A1 * | 6/2008 | Tsunoda | ............... | H01R 13/502 385/75 |
| 2010/0080563 A1 * | 4/2010 | DiFonzo | .............. | H01R 24/00 398/115 |
| 2010/0124845 A1 * | 5/2010 | Sabo | .................... | G02B 6/3817 439/607.01 |
| 2011/0076944 A1 * | 3/2011 | Mihota | ............... | H04L 27/0008 455/41.2 |
| 2011/0096323 A1 * | 4/2011 | Liu | ....................... | G02B 6/3885 356/73.1 |
| 2011/0123158 A1 * | 5/2011 | Little | ..................... | G02B 6/4292 385/77 |
| 2011/0230136 A1 * | 9/2011 | Washiro | ................. | H01P 5/187 455/41.1 |
| 2013/0087690 A1 * | 4/2013 | Sloey | ..................... | G02B 6/262 250/216 |
| 2013/0089290 A1 * | 4/2013 | Sloey | ..................... | G02B 6/4204 385/74 |
| 2014/0050491 A1 * | 2/2014 | Ko | .......................... | G02B 6/32 398/139 |
| 2014/0153881 A1 * | 6/2014 | Liff | ....................... | G02B 6/4214 385/89 |
| 2014/0270790 A1 | 9/2014 | Copper et al. | | |
| 2014/0314404 A1 | 10/2014 | Tseng | | |
| 2015/0241649 A1 * | 8/2015 | Chou | .................. | H05K 3/301 385/89 |
| 2015/0244465 A1 * | 8/2015 | Chou | .................. | H05K 3/301 398/201 |
| 2016/0124165 A1 * | 5/2016 | Luo | ........................ | G02B 6/3865 385/92 |
| 2018/0062454 A1 | 3/2018 | Besel et al. | | |
| 2019/0041589 A1 * | 2/2019 | Otani | ................... | H01L 31/0203 |
| 2019/0157738 A1 | 5/2019 | Shook et al. | | |

FOREIGN PATENT DOCUMENTS

| | | |
|---|---|---|
| CN | 111130600 A | 5/2020 |
| CN | 115118336 A | 9/2022 |

* cited by examiner

CONTACTLESS CONNECTOR AND CONTACTLESS CONNECTOR ASSEMBLY

BACKGROUND OF THE INVENTION

1. Field of the Invention

The present invention relates generally to a contactless connector and a contactless connector assembly including the contactless connector, and more particularly to a contactless connector and a contactless connector assembly capable of transmission of light signal.

2. Description of Related Arts

In one traditional design, the transmission of signals between two connectors is usually achieved through the mutual contact of their terminal, or through conductive paths on the circuit board, or metal cables. Conductive paths on circuit board and metal cables have limitations for high-speed, high-frequency signal transmission. As the signal rate increases, so does the loss of high-speed signals in the board and cable. The mutual contact between the terminals will also cause wear between the terminals, resulting in poor contact.

Improved contactless connector and contactless connector assembly are desired.

SUMMARY OF THE INVENTION

A main object of the present invention is to provide a contactless connector that can transmit signals through light.

To achieve the above-mentioned object, a contactless connector for mating with another contactless connector to transmit signals comprises: a circuit board; a light emitter arranged on the circuit board and capable of converting electrical signals into optical signals; a light emitter control chip arranged on the circuit board for controlling the operation of the light emitter; and a light-transmitting member at least partially covering the circuit board, the light emitter, and the light emitter control chip.

Another main object of the present invention is to provide a contactless connector assembly that can transmit signals through light.

To achieve the above-mentioned object, a contactless connector assembly comprises: a first contactless connector including a first circuit board, a light emitter arranged on the first circuit board and capable of converting electrical signals into optical signals, a light emitter control chip arranged on the first circuit board for controlling operation of the light emitter, and a first light-transmitting member at least partially covering the first circuit board, the light emitter, and the light emitter control chip; and a second contactless connector cooperating with the first contactless connector to transmit signals, the second contactless connector including a second circuit board, a light receiver disposed on the second circuit board and capable of receiving optical signals emitted by the light emitter and converting the received optical signals into electrical signals, an amplifier chip for amplifying the electrical signals, and a second light-transmitting member at least partially covering the second circuit board, the light receiver, and the amplifier chip.

Compared to prior art, the contactless connector and the contactless connector assembly of the present invention form a contactless optical transmission interface through the light emitter and the light receiver to realize the signal transmission between the connectors, the loss is small, and the signal transmission is stable. At the same time, the contactless connector assembly of the present invention is used in many different fields.

DETAILED DESCRIPTION OF THE PREFERRED EMBODIMENT

Figure 1:
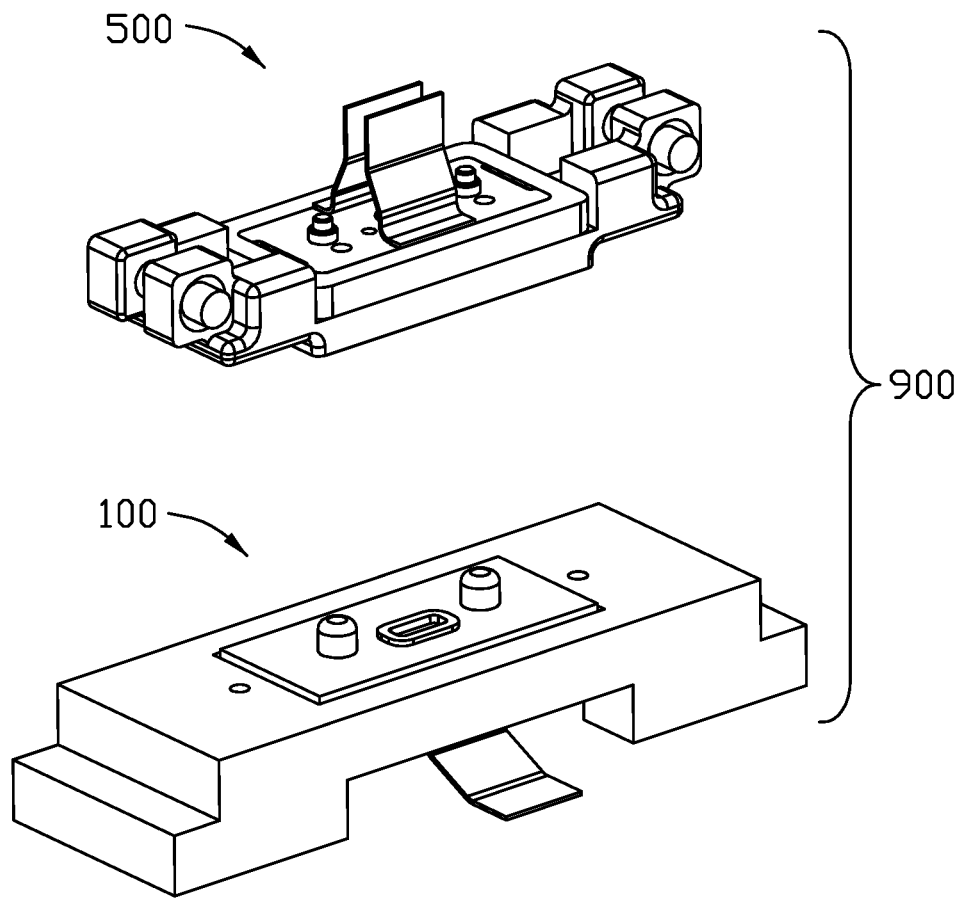
FIG. 1 is a perspective view of a contactless connector assembly in accordance with the present invention.
Figure 2:
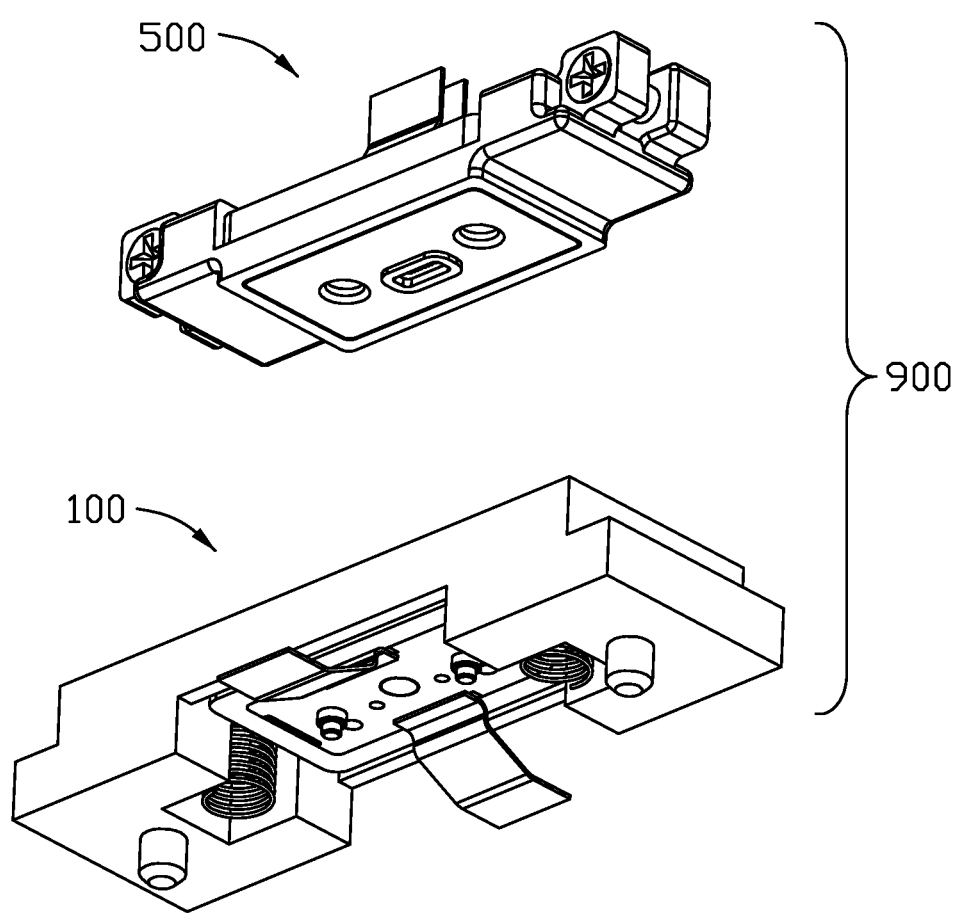
FIG. 2 is another perspective view of the contactless connector assembly in FIG. 1.
Figure 3:
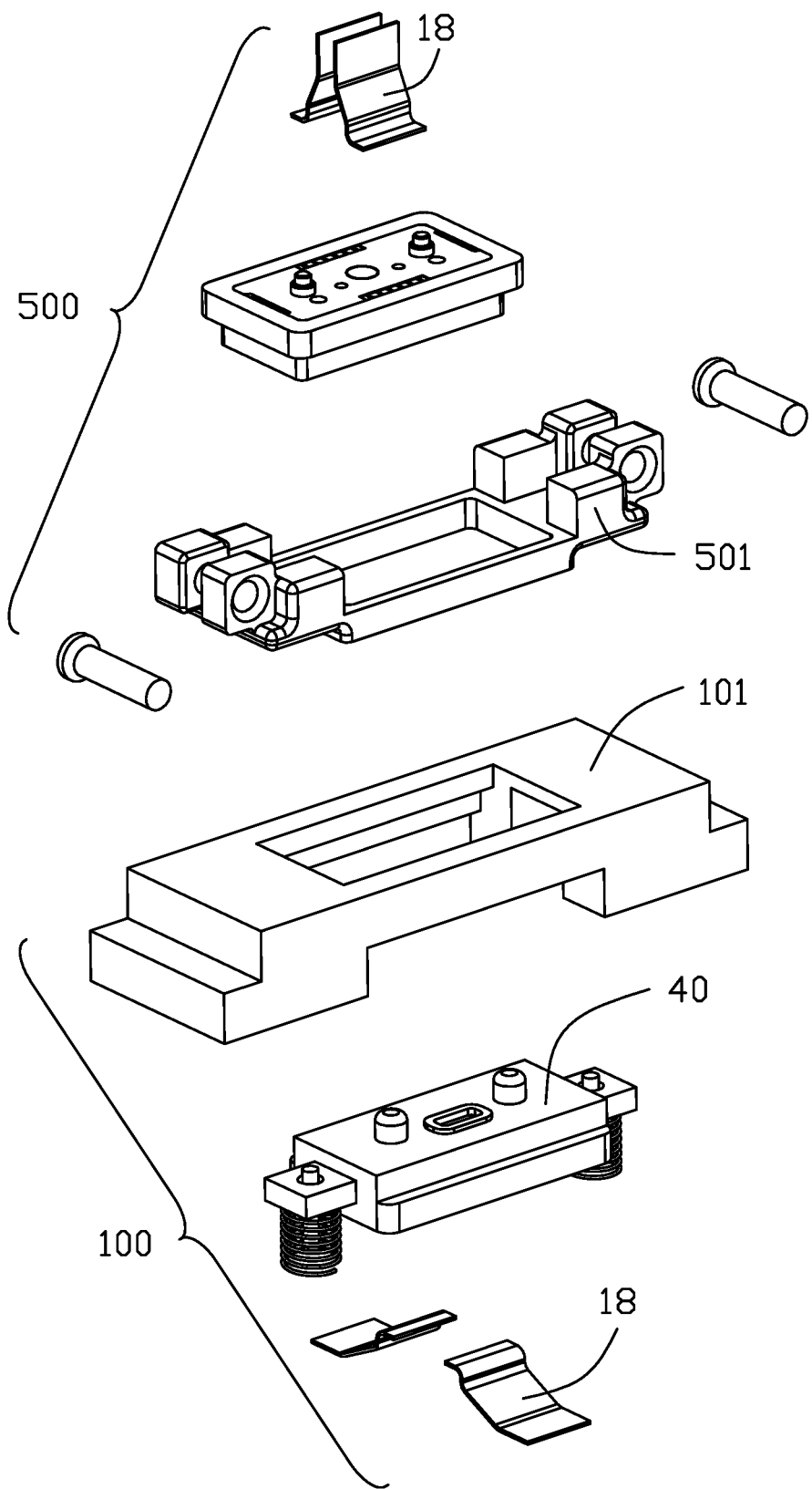
FIG. 3 is an exploded view of the contactless connector assembly in FIG. 1.
Figure 4:
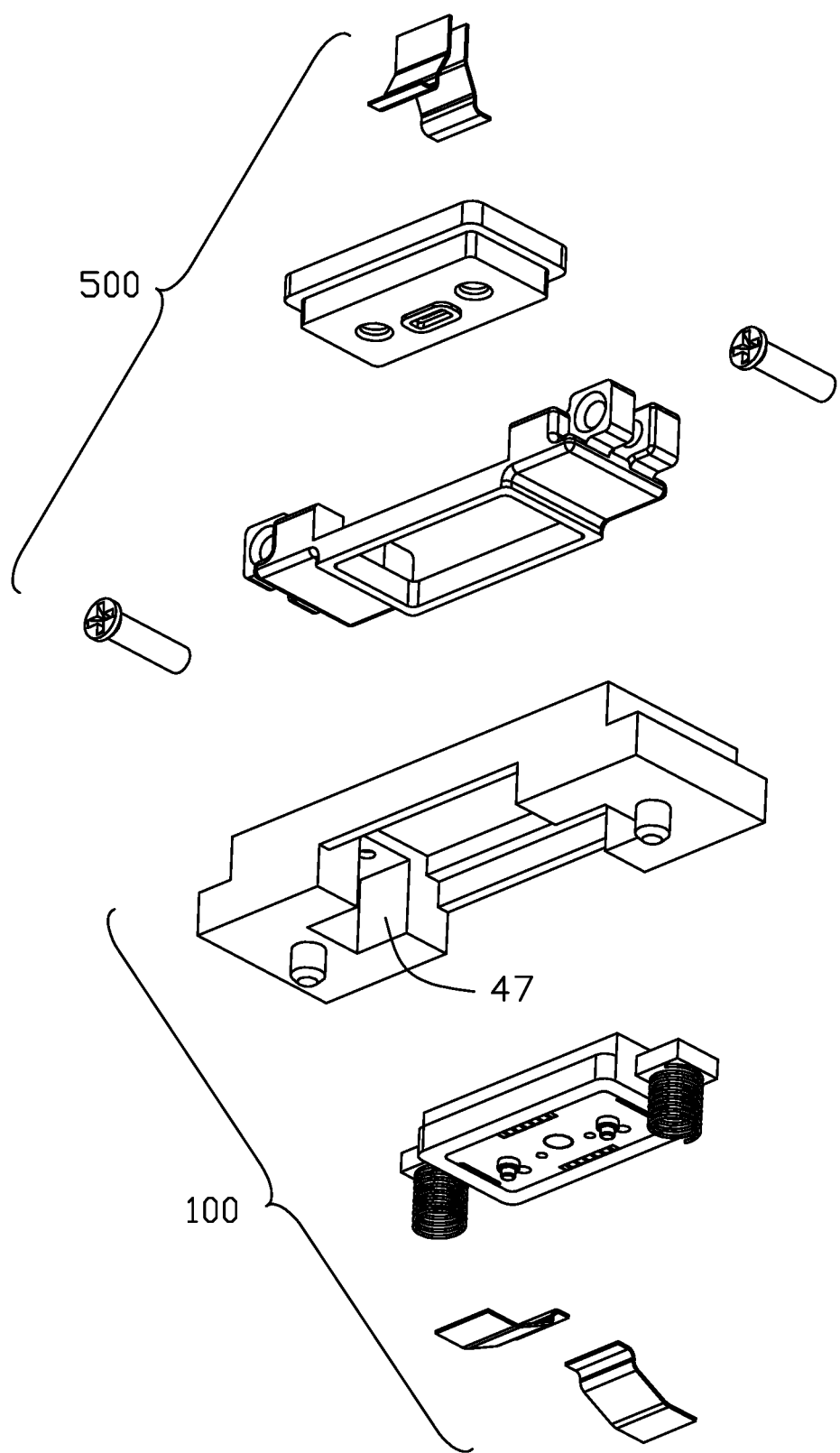
FIG. 4 is another exploded view of the contactless connector assembly in FIG. 3.

Referring to FIGS. 1-10, a contactless connector assembly 900 in accordance with the present invention is shown. The contactless connector assembly 900 comprises a first contactless connector 100 and a second contactless connector 500 that can cooperate with each other to transmit signals. A contactless optical transmission interface is formed between the first contactless connector 100 and the second contactless connector 500.

The first contactless connector 100 comprises a first circuit board 10, a light emitter 20 disposed on the first circuit board 10 and capable of converting electrical signals into optical signals, a light emitter control chip 30 disposed on the first circuit board 10 and capable of controlling the light emitter 20 to work, and a first light-transmitting member 40 at least partially covering the first circuit board 10, the light emitter 20, and the light emitter control chip 30. The second contactless connector 500 comprises a second circuit board 60, a light receiver 70 disposed on the second circuit board 60 that can receive the light signals sent by the light emitter 20 and convert the received light signals into electrical signals, an amplifier chip 80 that amplifies the electrical signals, and a second light-transmitting member 90 at least partially covering the second circuit board 60, the light receiver 70, and the amplifier chip 80. The first light-transmitting member 40 and the second light-transmitting member 90 do not affect the transmission and reception of signals. The first light-transmitting member 40 and the second light-transmitting member 90 may be made of PEI material or glass material, or the outside is made of PEI material or glass material, and the inside is filled with water or air.

The first contactless connector 100 in the present invention has the function of converting electrical signals into optical signals and sending out optical signals. The second contactless connector 500 has the function of receiving the optical signals and converting the optical signals to electrical signals. The first contactless connector 100 and the second contactless connector 500 can both have the functions of sending out and receiving optical signals. Specifically, it is achieved by the following, the first contactless connector 100 further includes a second light receiver 21 that can receive optical signals and convert the received optical signals into electrical signals, and a second amplifier chip 31 that amplifies the electrical signals. The second amplifier chip 31 and the light emitter control chip 30 are integrated into a single chip 301. The second contactless connector 500 further includes a second light emitter 71 that can convert electrical signals into optical signals, and a second light emitter control chip 81 disposed on the second circuit board 60 for controlling the work of the second light emitter 71. The amplifier chip 80 and the second light emitter control chip 81 are integrated into a single chip 801. The amplifier chip 80 and the second light emitter control chip 81 can also be provided separately. The amplifier chip 80 and the second amplifier chip 31 are both post-amplifier integrated circuit controller. The light emitter control chip 30 and the second light emitter control chip 81 are both laser diode drive controllers. The wavelength of the light emitted by the light emitter 20 and the second light emitter 71 is 850 nm. The wavelength of light emitted by the light emitter 20 can also be other suitable wavelengths. Both the second light receiver 21 and the light receiver 70 can be gallium arsenide photodiodes. As required, one or more optical paths may be set between the first contactless connector 100 and the second contactless connector 500. Specifically, it can be realized by the following: the light emitter 20 and the second light receiver 21 can be set as one or more, and the corresponding light receivers 70 and the second light emitter 71 can be set as one or more. The first circuit board 10 is provided with conductive pads 13 for inputting electrical signals and conductive pads 14 for outputting electrical signals. The second circuit board 60 is provided with conductive pads 63 for inputting electrical signals and conductive pad 64 for outputting electrical signals. Each conductive pad can be connected to the spring terminal of the board end base (not shown) or connected to the flexible board 18.

The first contactless connector 100 further includes a first mounting seat 25 mounted on the first circuit board 10, The light emitter 20 and the second light receiver 21 can be mounted on the first mounting seat 25. The height of the first mounting seat 25 is designed according to actual needs. The light emitter 20 and the second light receiver 21 can also be directly mounted on the first circuit board 10. Similarly, the second contactless connector 500 may also include a second mounting seat 75 mounted on the second circuit board.

The first contactless connector 100 further includes a magnetic element 11 disposed on the first circuit board 10. The magnetic element 11 and the light emitter are disposed on opposite sides of the first circuit board 10. The second contactless connector 500 further includes a magnetic element 61 disposed on the second circuit board 60. The magnetic element 61 and the light receiver are disposed on opposite sides of the second circuit board 60. The magnetic element 61 and the magnetic element 11 are attracted to each other to provide the mating force between the first contactless connector 100 and the second contactless connector 500. Both the magnetic element 11 and the magnetic element 61 can be magnets.

The contactless connector of the present invention has a smaller size. In the present invention, the first contactless connector 100 is substantially rectangular, with a length of 18.5 mm, a width of 10 mm, and a height of 5 mm A first lens 41 and a second lens 42 are disposed on the first light-transmitting member 40. The first lens 41 converts the light signal emitted by the light emitter 20 into mutually parallel light, and the second lens 42 focuses the parallel light. A third lens 93 and a fourth lens 94 are disposed one the second light-transmitting member 90. The third lens 93 converts the light focused by the second lens 42 into parallel light, and the fourth lens 94 focuses the parallel light to the light receiver 70.

The first contactless connector 100 further comprises a first housing 101 for securing it. The second contactless connector 500 further includes a second housing 501 for securing it. The left and right sides of the first light-transmitting member 40 further comprise a pair of protrusions, and each of the protrusion is provided with a through hole 43. A post 44 is installed in each of the through holes 43, a pair of springs 45 are correspondingly installed on the posts 44. The post 44 and the first light-transmitting member 40 can also be integrally formed. The first housing 101 is provided with a receiving groove 47 for receiving the corresponding spring 45 and the post 44. The spring 45 can quickly align and position the first light-transmitting member 40 and the second light-transmitting member 90

Figure 5:
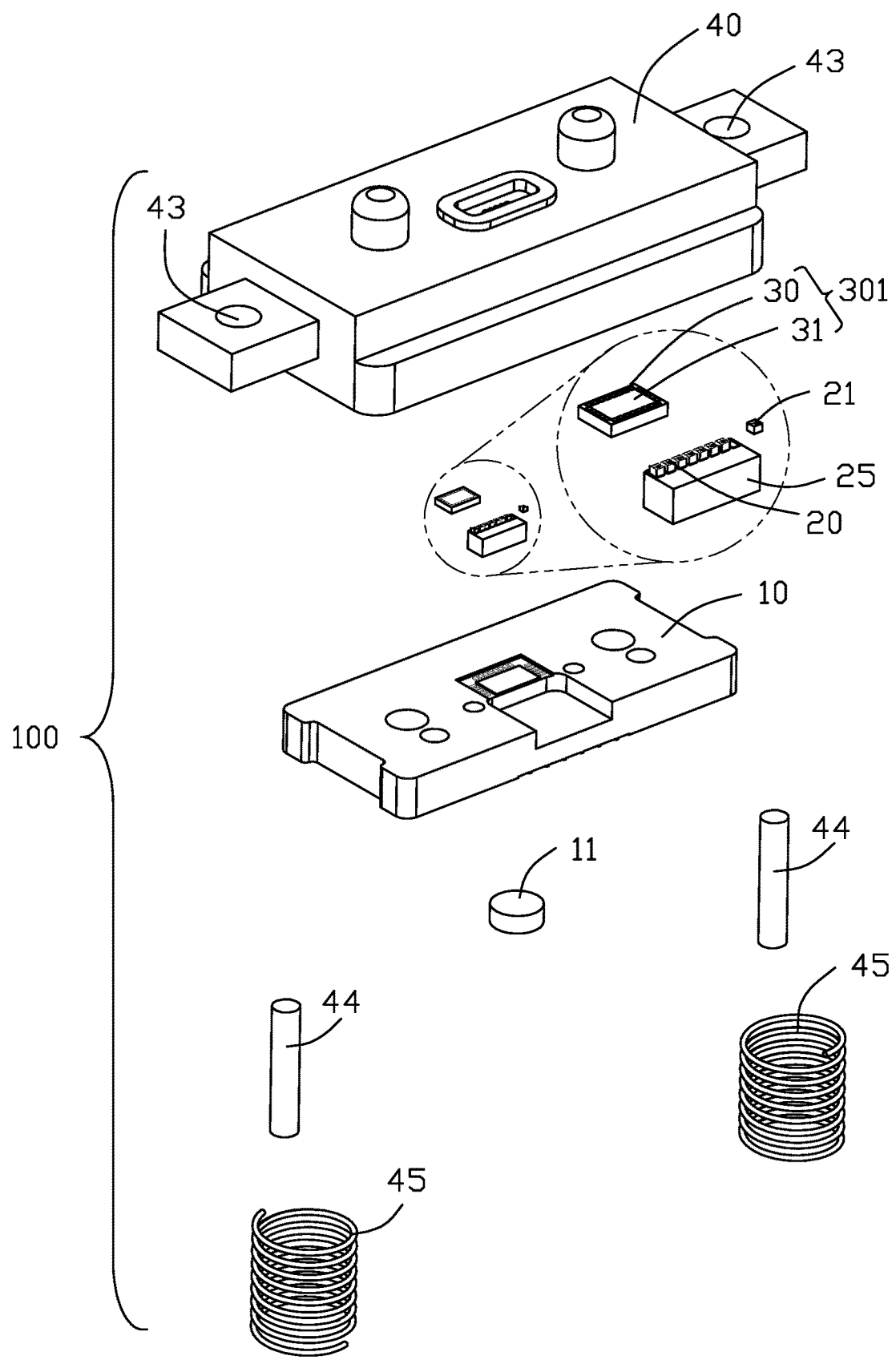
FIG. 5 is an exploded view of the first contactless connector in FIG. 1.
Figure 6:
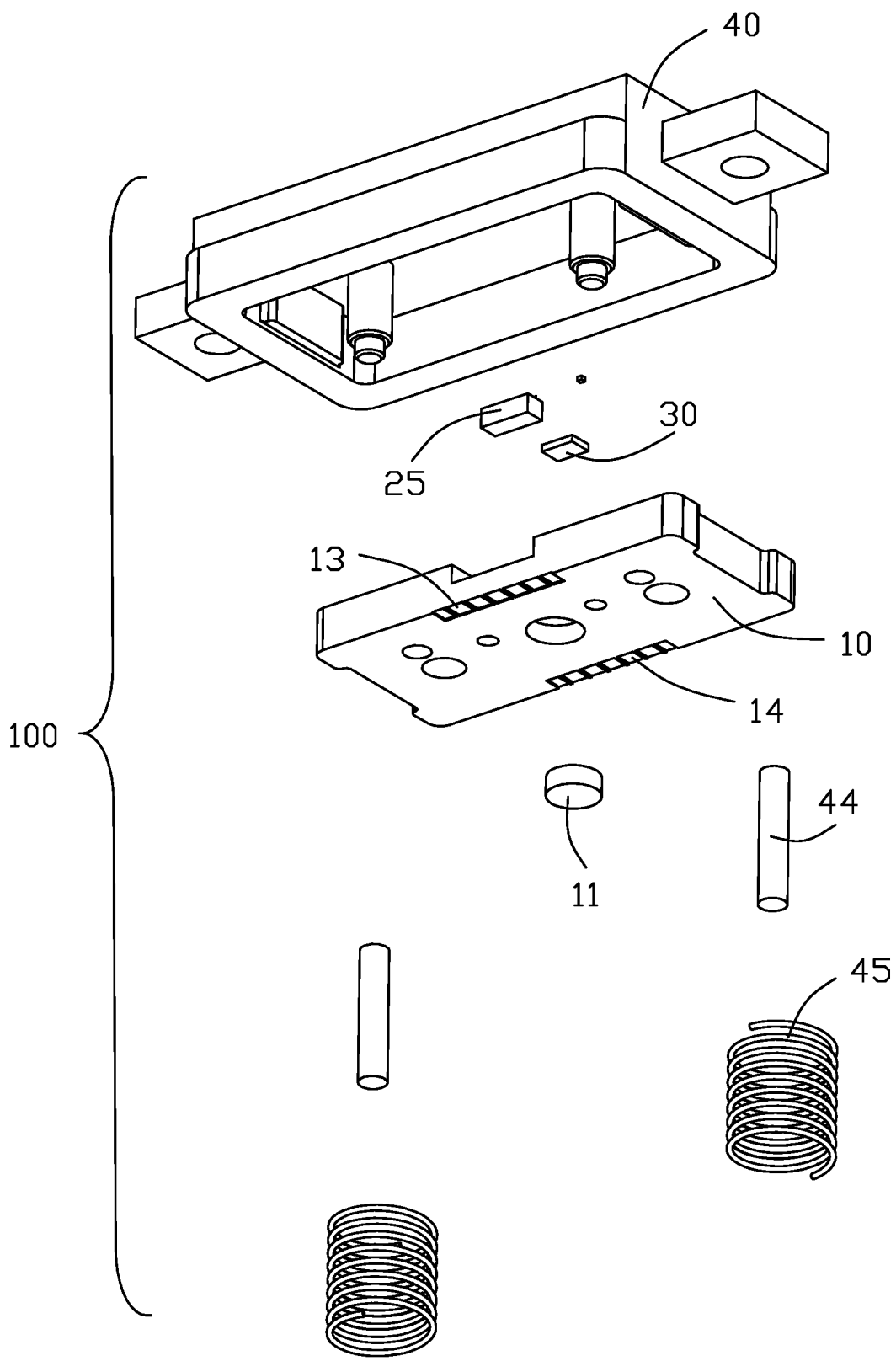
FIG. 6 is another exploded view of the first contactless connector in FIG. 5.
Figure 7:
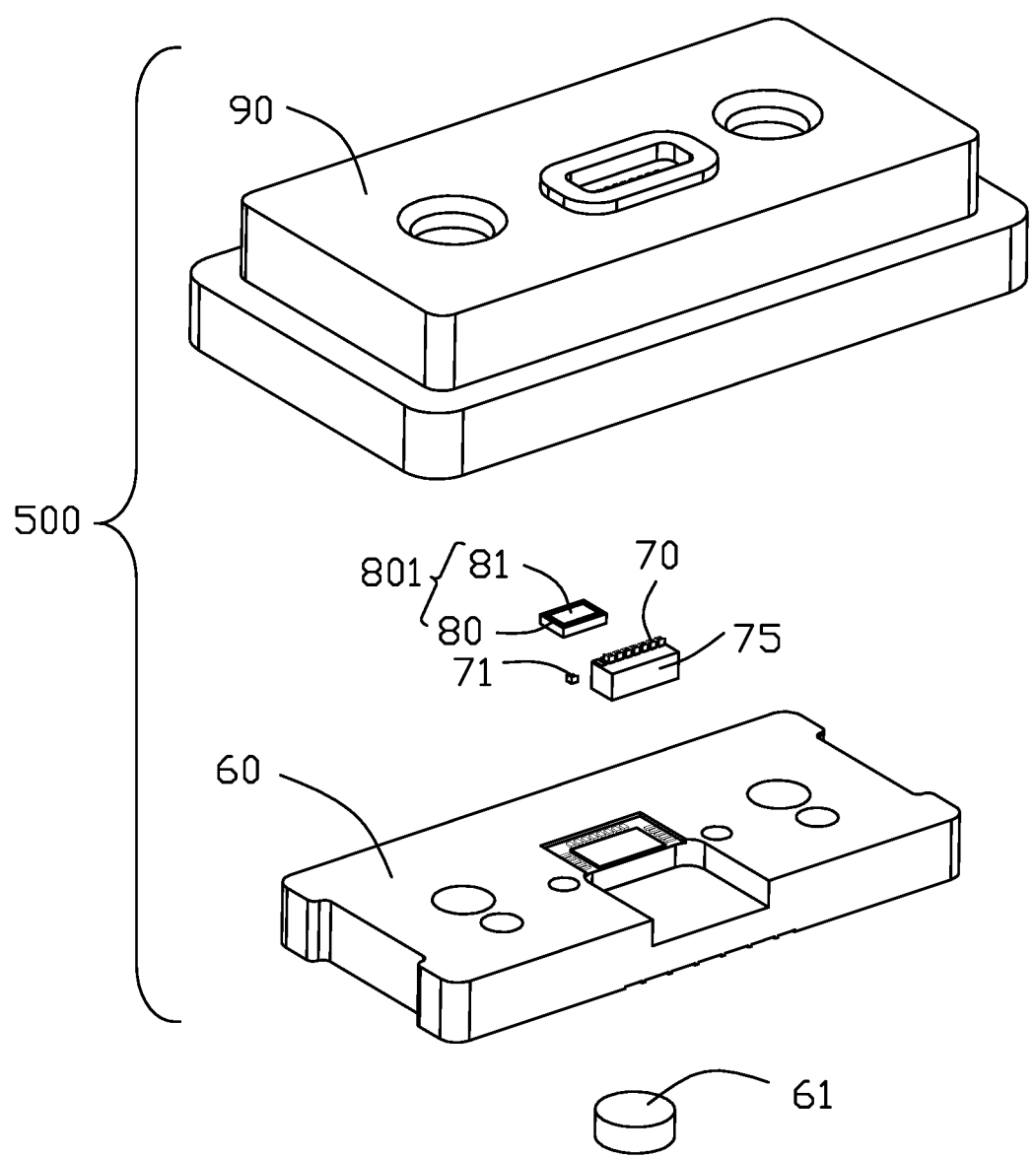
FIG. 7 is an exploded view of the second contactless connector in FIG. 1.
Figure 8:
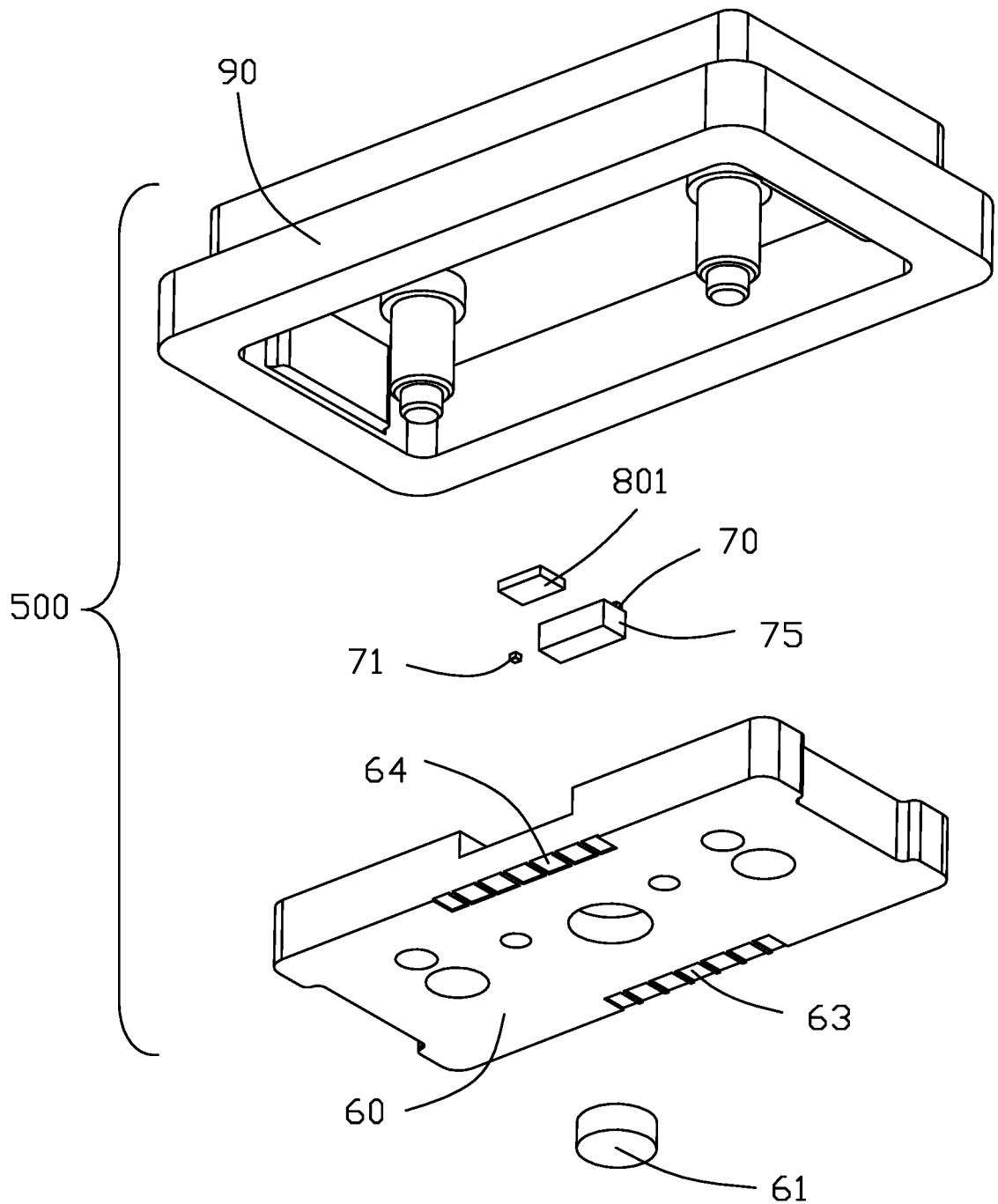
FIG. 8 is another exploded view of the second contactless connector in FIG. 7.
Figure 9:
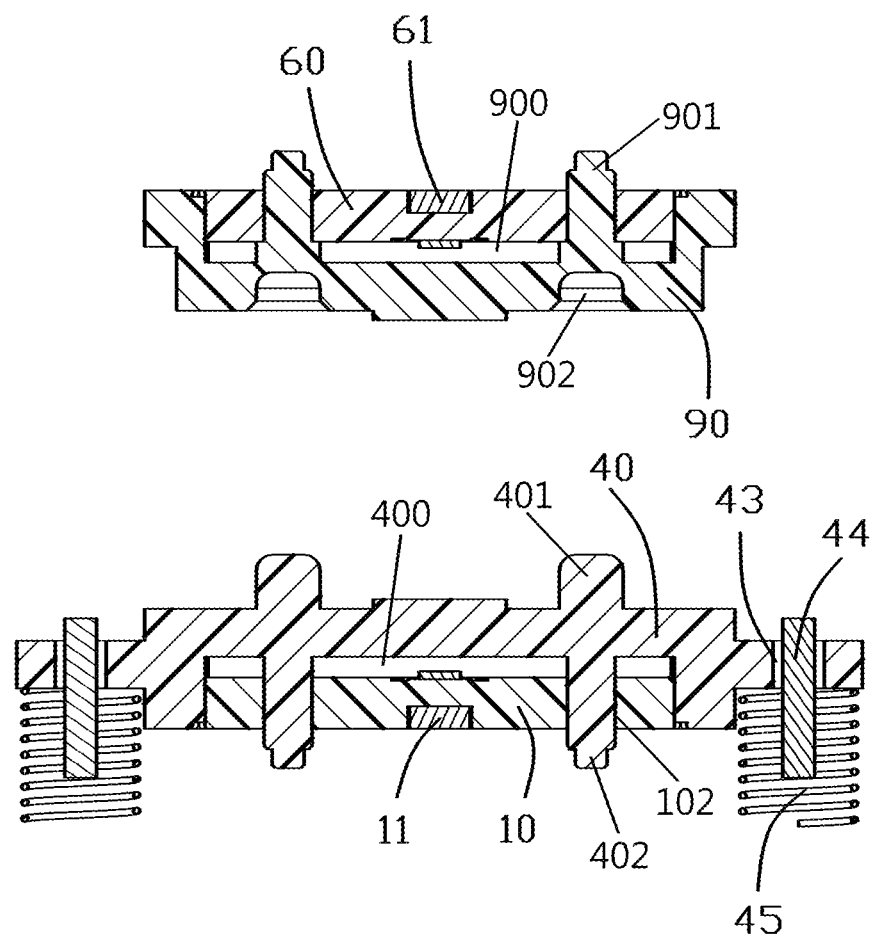
FIG. 9 is a cross-sectional view along the length of the contactless connector assembly in FIG. 1 after mating.
Figure 10:
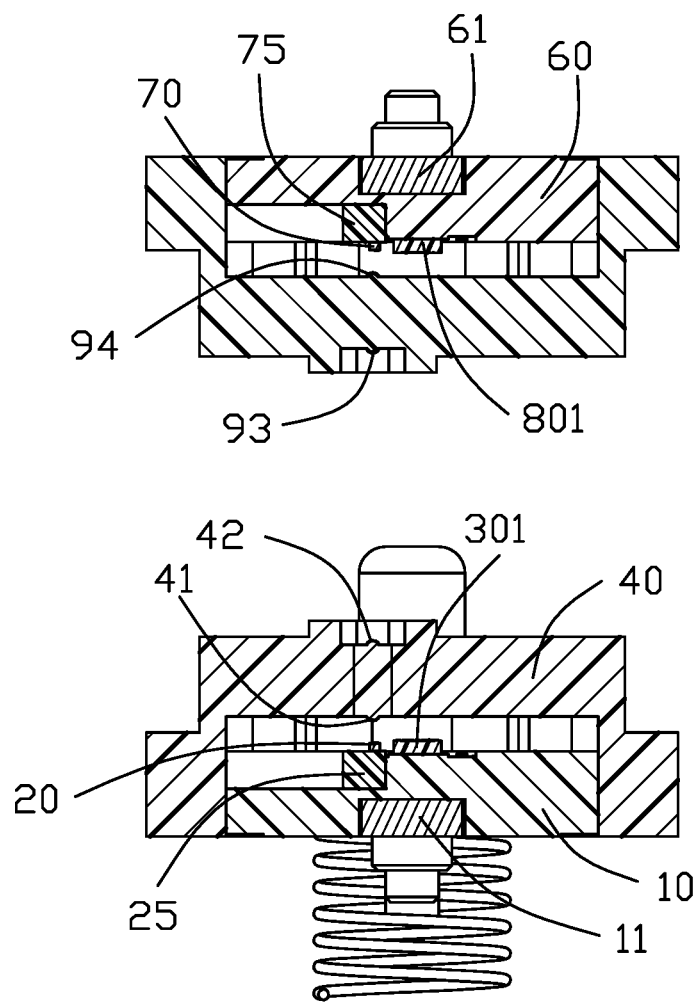
FIG. 10 is a cross-sectional view along the width of the contactless connector assembly in FIG. 1 after mating.

Referring to FIG. 9 and FIG. 5, the first light-transmitting member 40 of the first contactless connector 100 is formed with a first receiving portion 400 at a lower side thereof. The first circuit board 10, the light emitter 20, and the light emitter control chip 30 are received in the first receiving portion 400. Referring to FIG. 9 and FIG. 7, the second light-transmitting member 90 of the second contactless connector 500 is formed with a second receiving portion 900 at the upper side thereof. The second circuit board 60, the light receiver 70, and the amplifier chip 80 are received in the first receiving portion 900. The first light-transmitting member 40 has a pair of outer positioning posts 401 protruded upward from the upper side thereof. The second light-transmitting member 90 has a pair of positioning recessed potions 902 concavely formed on the lower side thereof. The pair of outer positioning posts 401 are inserted in the pair of positioning recessed potions 902, respectively. The first light-transmitting member 40 also has a pair of first retaining posts 402 protruded from the lower side thereof and penetrated through the fixing holes 102 of the first circuit board 10. The second light-transmitting member 90 also has a pair of second retaining posts 901 protruded from the upper side thereof and penetrated through the second circuit board 60.

Figure 11:
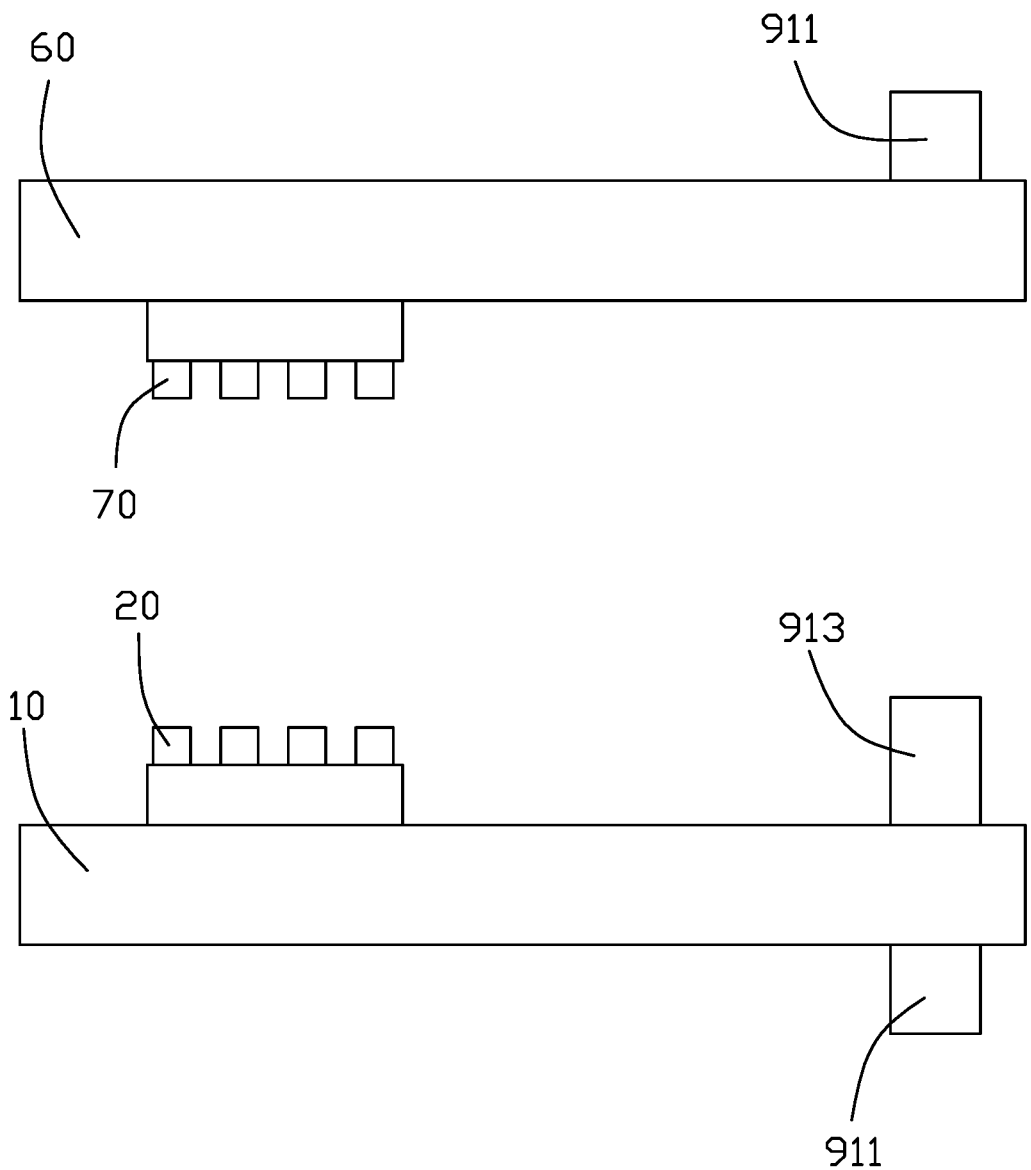
FIG. 11 is a schematic diagram of the first working mode of the contactless connector assembly in FIG. 1.
Figure 12:
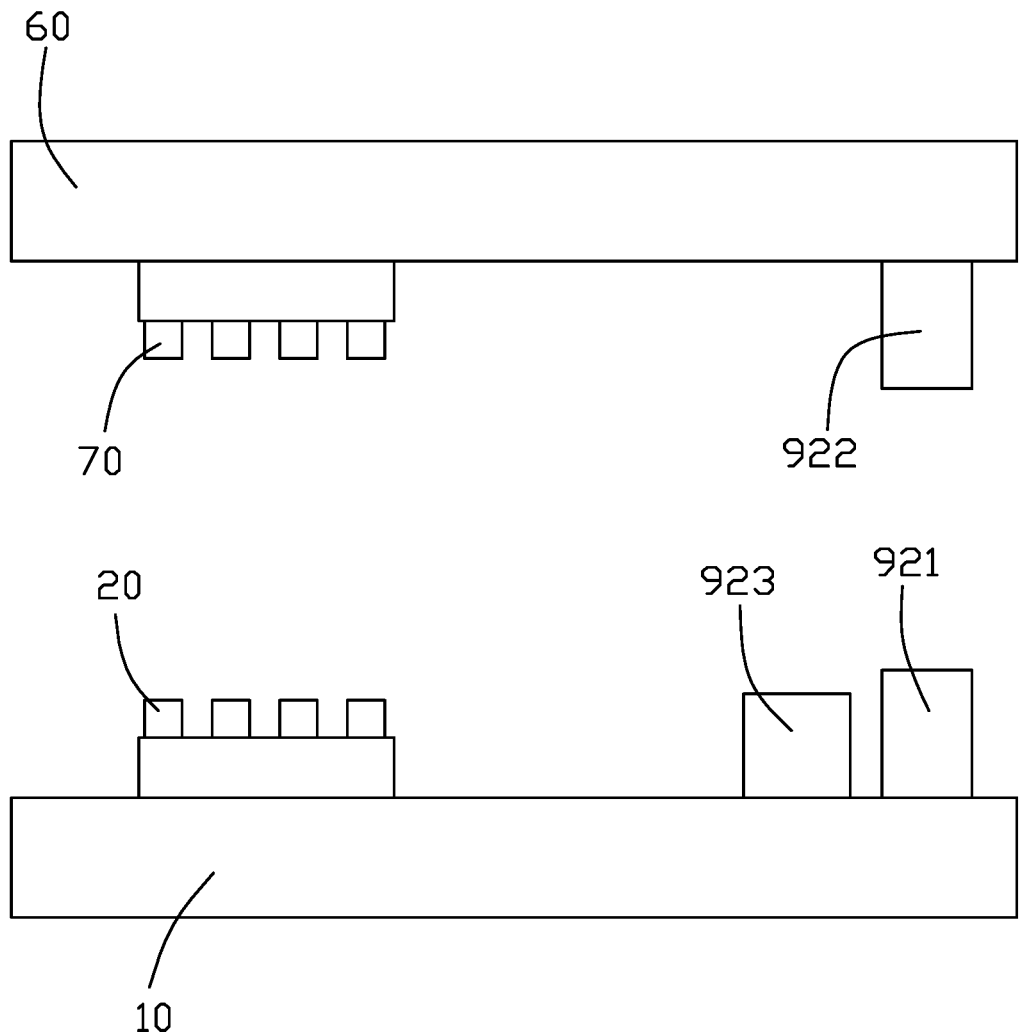
FIG. 12 is a schematic diagram of the second working mode of the contactless connector assembly in FIG. 1.
Figure 13:
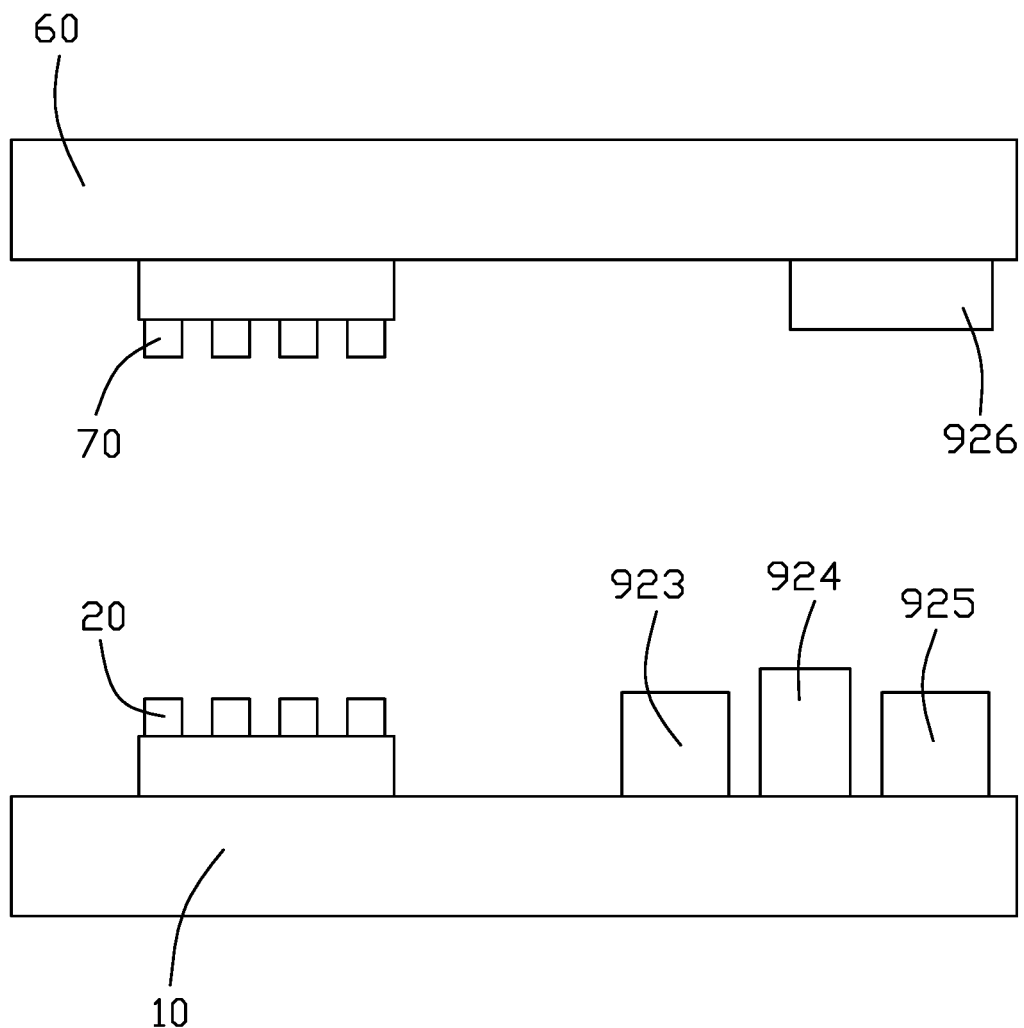
FIG. 13 is a schematic diagram of the third working mode of the contactless connector assembly in FIG. 1.
Figure 14:
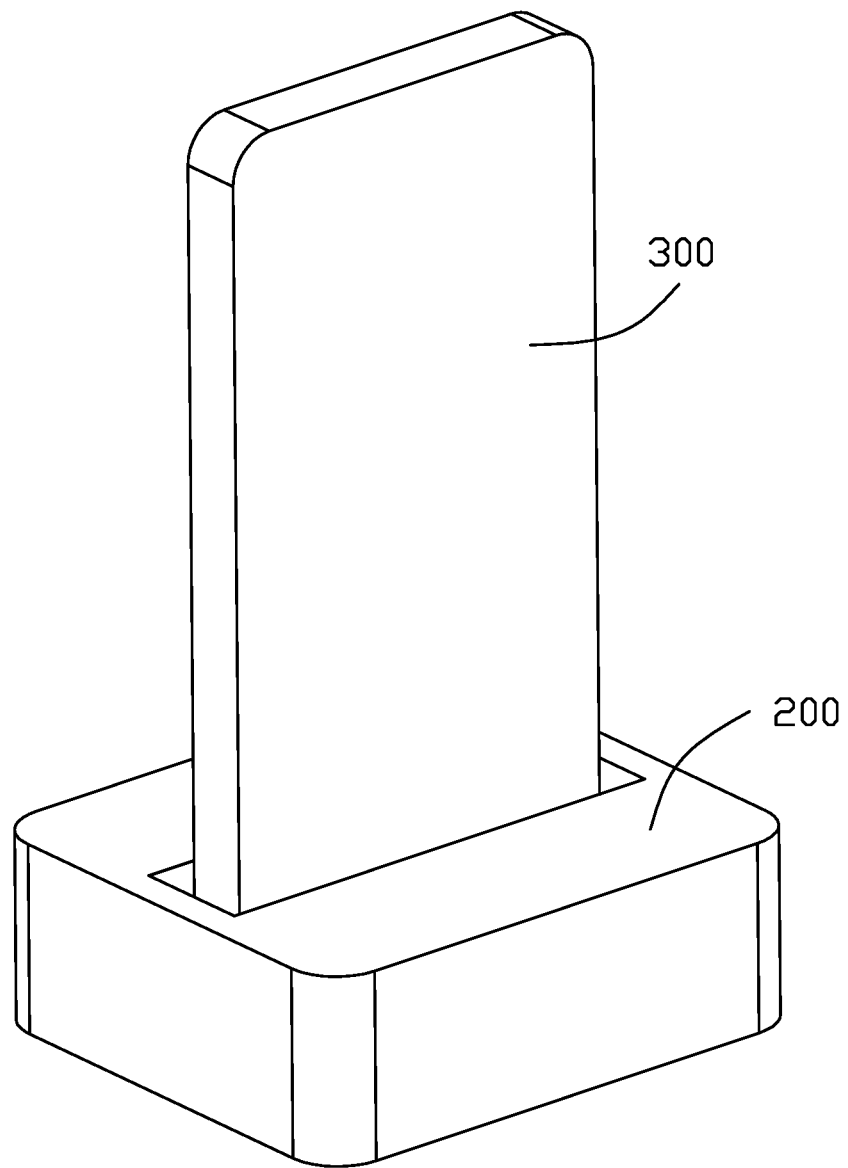
FIG. 14 is an application scenario of the contactless connector assembly in FIG. 1, which is respectively set on the mobile phone and its corresponding base.
Figure 15:
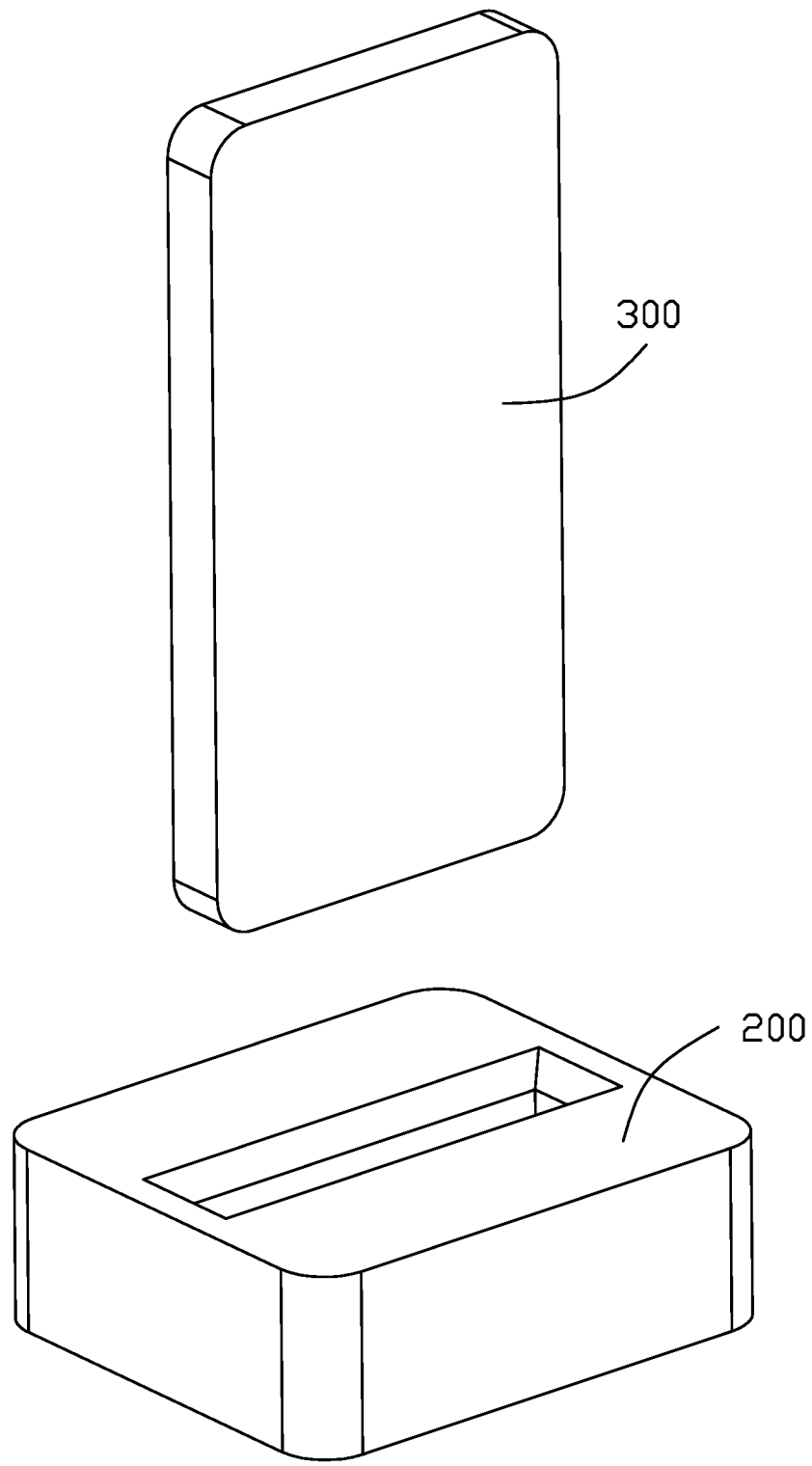
FIG. 15 is a perspective view of the mobile phone and its corresponding base in FIG. 14, separated from each other.
Figure 16:
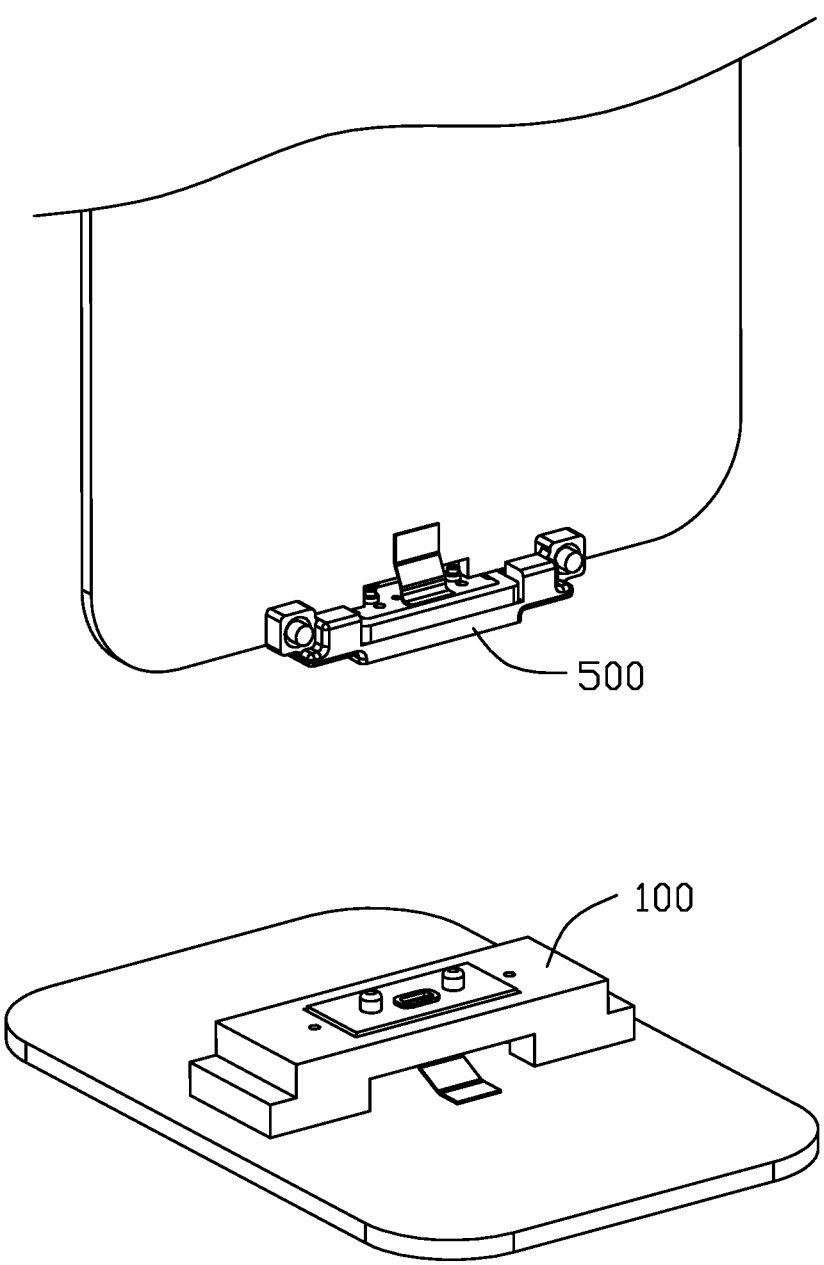
FIG. 16 is a perspective view removing other external structures from the mobile phone and removing other external structures of corresponding base in FIG. 15.
Figure 17:
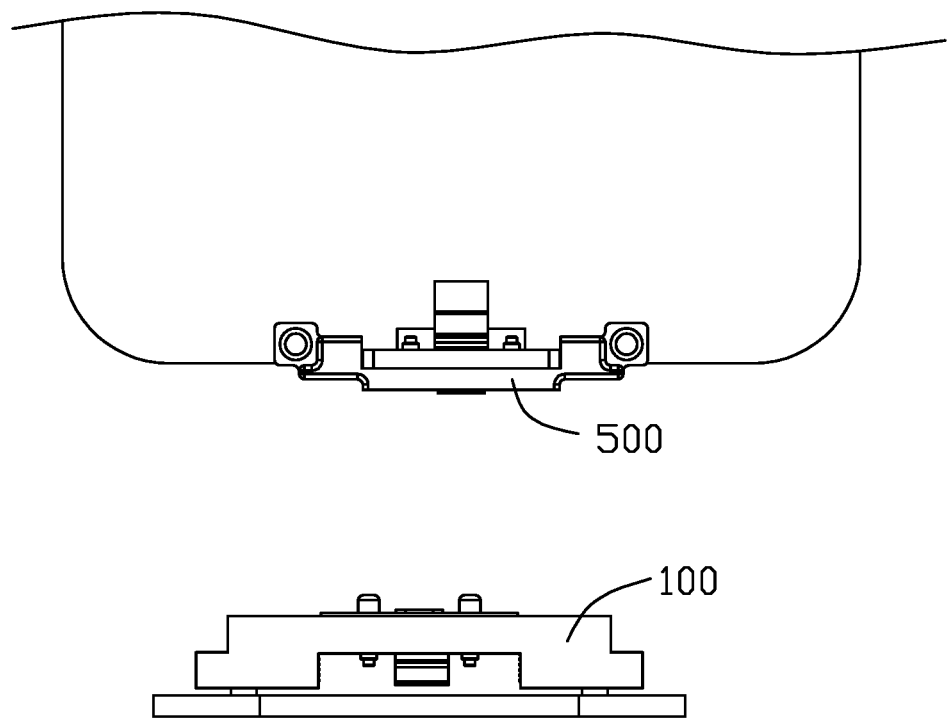
FIG. 17 is a front view of FIG. 16.

Referring to FIGS. 11-13, the contactless connector assembly 900 of the present invention further includes a sensing device that can start its operating mode. FIG. 11 shows a schematic diagram of a first embodiment of the sensing device starting its working mode. For ease of understanding, in this embodiment, the lower connector is the first contactless connector 100 and the upper connector is the second contactless connector 500. The sensing device includes two magnetically opposed magnets 911 located on the first contactless connector 100 and the second contactless connector 500, and a Hall sensor 912 located between the magnets 911. The Hall sensor 912 senses the magnetic field formed between the two magnets when the first contactless connector 100 and the second contactless connector 500 are close to each other to start the contactless connector assembly 900 to work.

FIG. 12 shows a schematic diagram of a second embodiment of the sensing device starting its working mode. Compared with the first embodiment, in this embodiment, the sensing device includes an emitter 921 that can emit light and a receiver 922 that can receive the light from the emitter 921. The emitter 921 is located on the first circuit board 10, and the receiver 922 is located on the second circuit board 60. The sensing device further includes an amplifier 923 on the second circuit board 60 that can amplify the signal received by the receiver 922. The emitter 921 can also be set on the second contactless connector 500, and the receiver 922 and the amplifier 923 can be set on the first contactless connector 100. The emitter 921 can be a light-emitting diode or a laser transmitter. The receiver 922 receives the light emitted by the emitter 921 when the first contactless connector 100 and the second contactless connector 500 are close to each other to initiate the contactless connector assembly 900 to work.

FIG. 13 shows a schematic diagram of a third embodiment of the sensing device starting its working mode. In this embodiment, the sensing device includes an emitter 924 that can emit light, a receiver 925 that can receive light and a reflective element 926 that can reflects light from the emitter 924. The emitter 924 and the receiver 925 are on the first contactless connector 100, and the reflective element 926 is on the second contactless connector 500. The receiver 925 can receive the light reflected back by the reflective element 926. Of course, the emitter 924 and the receiver 925 can also be located on the second contactless connector 500, and the reflective element 926 can be located on the first contactless connector 100. The receiver 925 receives the light reflected by the reflective element 926 when the first contactless connector 100 and the second contactless connector 500 are close to each other to start the contactless connector assembly 900 in working condition The contactless connector assembly 900 of the present invention has broad application prospects. It can be applied to interfaces that need to transmit high-speed data and video, such as data center switches, it can be applied to equipment that is extremely sensitive to EMI, such as medical and military. In addition, the optical signal transmitted from the two contactless connectors can be transmitted in air or liquid, and it can transmit a variety of signals because of the chip and photoelectric conversion functions, such as LVDS (Low Voltage Differential Signaling), TMDS (Time Minimized Differential Signaling), CML (Current Mode Logic) and other signals that can be transmitted.

The contactless connector of the present invention has a very small size and can be applied to 3C consumer products, such as mobile phones, notebooks or tablet computers, and it can also available for short-distance and high-speed board connections, such as data center switches or servers. It can also be used as anti-electromagnetic interference equipment such as operating table endoscope. It's also available to connect the two connectors via optical fiber to transmit the signal inside the large panel or TV GPU (graphics card) to the controller.

Referring to FIGS. 14-17, an application scenario of the contactless connector assembly 900 of the present invention, in this application scenario, the first contactless connector 100 is located in the base 200, and the second contactless connector 500 is located in the mobile phone 300.

The contactless connector assembly of the present invention can be used for wireless charging, signal transmission between wireless phones, double panels and detachable laptops, foldable and expandable laptop applications, video wall applications, internal transmission for a large TV or laptop. In addition, the contactless connector and connector assembly of the present invention realize signal transmission through optical signals, with low loss and stable signal transmission, and the contactless connector can be used in many fields.

What is claimed is:

1. A contactless connector for mating with another contactless connector to transmit signals, comprising:
    a circuit board, having a first side and a second side being opposite to each other;
    a light emitter arranged on the first side of the circuit board and capable of converting electrical signals into optical signals;
    a light emitter control chip arranged on the first side of the circuit board for controlling the operation of the light emitter; and
    a light-transmitting member, having a first surface and a second surface being opposite to each other, the first surface being mated with the another contactless connector, the second surface being partially concaved to cover the circuit board, the light emitter, and the light emitter control chip;
    wherein the light-transmitting member includes a first lens formed on the second surface and a second lens formed on the first surface, the first lens faces the circuit board and is arranged to positionally corresponded to the light emitter, and the second lens faces transfers light signals from the first lens to the another contactless connector.

2. The contactless connector as claimed in claim 1, wherein the first lens converts the light signals emitted by the light emitter into mutually parallel lights, and the second lens focuses the parallel lights, the second surface of the light-transmitting member is concavely formed with a receiving portion, the circuit board is received in the receiving portion, the light-transmitting member has a pair of inner positioning posts protruded into the receiving portion, the circuit board forms a pair of positioning holes, and the pair of inner positioning posts passes through the pair of positioning holes, respectively.

3. The contactless connector as claimed in claim 2, wherein the circuit board includes a plurality of first conductive pads for inputting electrical signals, and a plurality of second conductive pads for outputting electrical signals, a magnetic element is disposed on the second side of the circuit board between the first conductive pads and the second conductive pads, the magnetic element is used for mutual magnetic attraction with a corresponding magnetic element of the another contactless connector to provide a mating force between the contactless connector and the another contactless connector.

4. The contactless connector as claimed in claim 3, wherein the circuit board further includes a light receiver capable of receiving optical signals and converting the received optical signals into electrical signals and an amplifier chip for amplifying the electrical signals, wherein the light receiver and the amplifier chip are disposed between the pair of positioning holes.

5. The contactless connector as claimed in claim 4, wherein the light emitter control chip and the amplifier chip are integrated into a single chip.

6. A contactless connector assembly comprising:
a first contactless connector comprising:
  a first circuit board;
  a light emitter arranged on the first circuit board and capable of converting electrical signals into optical signals;
  a light emitter control chip arranged on the first circuit board for controlling operation of the light emitter; and
  a first light-transmitting member forming a first receiving portion, wherein the first circuit board, the light emitter, and the light emitter control chip are received in the first receiving portion; and
a second contactless connector cooperating with the first contactless connector to transmit signals, the second contactless connector comprising:
  a second circuit board;
  a light receiver disposed on the second circuit board and capable of receiving optical signals emitted by the light emitter and converting the received optical signals into electrical signals;
  an amplifier chip for amplifying the electrical signals; and
  a second light-transmitting member forming a second receiving portion, wherein the second circuit board, the light receiver, and the amplifier chip are received in the first receiving portion;
  wherein the first light-transmitting member forms a pair of outer positioning posts, the second light-transmitting member forms a pair of positioning recessed potions, the pair of outer positioning posts are inserted in the pair of positioning recessed potions, respectively.

7. The contactless connector assembly as claimed in claim 6, further comprising magnetic elements on the first contactless connector and the second contactless connector and a Hall sensor between the magnetic elements; wherein the Hall sensor senses the magnetic field formed between the magnetic elements, when the first contactless connector and the second contactless connector are close to each other to start the contactless connector assembly to work.

8. The contactless connector assembly as claimed in claim 6, further comprising an emitter on one of the first contactless connector and the second contactless connector for emitting light and a receiver on the other of the first contactless connector and the second contactless connector for receiving light from the emitter; wherein the receiver receives the light emitted by the emitter when the first contactless connector and the second contactless connector are close to each other to initiate the contactless connector assembly to work.

9. The contactless connector assembly as claimed in claim 6, further comprising a emitter for emitting light, a receiver for receiving light, and a reflective element for reflecting light from the emitter back, and wherein the emitter and the receiver are disposed on one of the first contactless connector and the second contactless connector, and the reflective element is disposed on the other of the first contactless connector and the second contactless connector; wherein the receiver receives the light reflected by the reflective element when the first contactless connector and the second contactless connector are close to each other to start the contactless connector assembly in working condition.

10. The contactless connector assembly as claimed in claim 9, further comprising an amplifier capable of amplifying the optical signal received by the receiver, and the emitter is a light-emitting diode or a laser transmitter.

11. The contactless connector as claimed in claim 1, wherein the light-transmitting member has a pair of outer positioning posts protruded outward from the first surface, the pair of outer positioning posts is configured to position the another contactless connector to each other.

12. The contactless connector as claimed in claim 1, wherein two sides of the light-transmitting member respectively include a pair of protrusions, each of the pair of protrusions is provided with a through hole, a post is installed in each of the through holes, and a pair of springs are correspondingly installed on the posts.

13. The contactless connector as claimed in claim 12, further comprising a housing, the housing is provided with a receiving groove for correspondingly receiving the spring and the post.

14. The contactless connector as claimed in claim 13, wherein the springs are configured to elastically push the light-transmitting member to tightly contact with the another contactless connector.

* * * * *